United States Patent
Lee et al.

(10) Patent No.: US 9,734,128 B2
(45) Date of Patent: Aug. 15, 2017

(54) METHOD FOR RECONSTRUCTING SPARSE SIGNAL IN FINITE FIELD, APPARATUS FOR RECONSTRUCTING SPARSE SIGNAL IN FINITE FIELD, AND RECORDING MEDIUM FOR RECORDING RECONSTRUCTION METHOD

(71) Applicant: GWANGJU INSTITUTE OF SCIENCE AND TECHNOLOGY, Gwangju (KR)

(72) Inventors: Heung No Lee, Gwangju (KR); Jin Taek Seong, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 268 days.

(21) Appl. No.: 14/405,234

(22) PCT Filed: Jun. 3, 2013

(86) PCT No.: PCT/KR2013/004875
§ 371 (c)(1),
(2) Date: Dec. 3, 2014

(87) PCT Pub. No.: WO2013/183896
PCT Pub. Date: Dec. 12, 2013

(65) Prior Publication Data
US 2015/0149520 A1    May 28, 2015

(30) Foreign Application Priority Data
Jun. 5, 2012  (KR) .................. 10-2012-0060225

(51) Int. Cl.
*G06F 17/10*    (2006.01)
*H03H 17/02*    (2006.01)

(52) U.S. Cl.
CPC .......... *G06F 17/10* (2013.01); *H03H 17/0255* (2013.01)

(58) Field of Classification Search
CPC .......... G06F 17/10; G06F 17/11; G06F 17/16; G06F 17/18; H03H 17/0255
See application file for complete search history.

(56) References Cited

U.S. PATENT DOCUMENTS

| 5,416,750 A | 5/1995 | Doyen et al. |
| 6,611,794 B1 * | 8/2003 | Fleming-Dahl ....... H04L 27/001 324/614 |

(Continued)

FOREIGN PATENT DOCUMENTS

| KR | 101056287 B1 | 8/2011 |
| KR | 20110110800 A | 10/2011 |
| KR | 101209908 B1 | 12/2012 |

OTHER PUBLICATIONS

Jeong Jae-Joon, A study on classification accuracy improvements using orthogonal summation of posterior probabilities, The Journal of GIS Association of Korea, Apr. 2004, pp. 111-125, vol. 12, No. 1.

(Continued)

*Primary Examiner* — Chuong D Ngo
(74) *Attorney, Agent, or Firm* — Hauptman Ham, LLP

(57) ABSTRACT

A method for recovering a sparse signal of a finite field may include: updating discrete probability information of a target signal element of the finite field and discrete probability information of a measurement signal element of the finite field by exchanging the discrete probability information of the target signal element with the discrete probability information of the measurement signal element a predetermined number of times, wherein the target signal element and the measurement signal element are related to each other; calculating a final posteriori probability based on a priori (Continued)

probability of the target signal element and the discrete probability information of the measurement signal element, acquired as the exchange result; and recovering the target signal by performing maximum posteriori estimation to maximize the final posteriori probability.

20 Claims, 6 Drawing Sheets

(56) References Cited

U.S. PATENT DOCUMENTS

| | | | | |
|---|---|---|---|---|
| 7,269,241 B2* | 9/2007 | Siltanen | ............... | A61B 6/032 |
| | | | | 378/4 |
| 8,711,015 B2* | 4/2014 | Mustiere | ............... | H03M 7/30 |
| | | | | 341/87 |
| 8,738,376 B1* | 5/2014 | Goel | ................... | G10L 15/14 |
| | | | | 704/205 |
| 2010/0246920 A1* | 9/2010 | Vaswani | ........... | G06K 9/00523 |
| | | | | 382/131 |
| 2013/0289942 A1* | 10/2013 | Wu | ..................... | H03M 7/3062 |
| | | | | 702/189 |

OTHER PUBLICATIONS

Kang Jae Wook, Stochastically-Sparse Signal approximation via Message Passing Algorithm (CS-MPA), Technical report, 2010, pp. 1-11.

International Search Report for PCT/KR2013/004875 mailed on Jul. 30, 2013.

\* cited by examiner

METHOD FOR RECONSTRUCTING SPARSE SIGNAL IN FINITE FIELD, APPARATUS FOR RECONSTRUCTING SPARSE SIGNAL IN FINITE FIELD, AND RECORDING MEDIUM FOR RECORDING RECONSTRUCTION METHOD

TECHNICAL FIELD

The present disclosure relates to a method and apparatus for recovering a sparse signal of a finite field and a recording medium storing the method, and more particularly, to a method and apparatus for recovering a sparse signal of a finite field, which repetitively updates a likelihood probability and a posteriori probability using belief propagation when a measurement signal is received from a sparse signal transmission device, and recovers a solution, at which the updated posteriori probability is maximized, into a target signal, the measurement signal obtained by compressing a sparse target signal through a sparse measurement matrix in a finite field.

BACKGROUND ART

A sparse signal refers to a signal which includes nonzero elements of which the number is equal to or smaller than K (K<<N), when the length of the signal is set to N. Compressed sensing is a signal compression processing method which is capable of significantly reducing the information amount of the sparse signal.

A transmitter generates a compressed-sensed measurement signal Y by linearly projecting a target sparse signal X to a measurement matrix A, and transmits the generated measurement signal Y. A receiver searches for a target sparse signal X which has the minimum number of nonzero elements among infinite solutions which satisfies Y=AX. Such a sparse signal recovery method may be simply expressed as the following equation. However, the sparse signal recovery method requires N searches to recover the target signal. Thus, when N and K are increased, the complexity of the method is exponentially increased.

$$\min_X \|X\|_0$$

subject to $$AX = Y$$

$\|X\|_0 :=$ the number of nonzero elements in $X$

In addition, the method for recovering a compressed-sensed signal may include an OMP (Orthogonal Matching Pursuit) method, a StOMP (Stagewise Orthogonal Matching Pursuit), and a basis pursuit method. However, such recovery methods are operated on the real number system, and have a limitation in recovering a sparse signal of a finite field.

DISCLOSURE

Technical Problem

Various embodiments are directed to a method and apparatus for recovering a sparse signal of a finite field, which repetitively updates a likelihood probability and a posteriori probability using belief propagation when a measurement signal is received from a sparse signal transmission device, and recovers a solution, at which the updated posteriori probability is maximized, into a target signal, the measurement signal obtained by compressing a sparse target signal through a sparse measurement matrix in a finite field.

Technical Solution

In an embodiment, a method for recovering a sparse signal of a finite field may include: updating discrete probability information of a target signal element of the finite field and discrete probability information of a measurement signal element of the finite field by exchanging the discrete probability information of the target signal element with the discrete probability information of the measurement signal element a predetermined number of times, wherein the target signal element and the measurement signal element are related to each other; calculating a final posteriori probability based on a priori probability of the target signal element and the discrete probability information of the measurement signal element, acquired as the exchange result; and recovering the target signal by performing maximum posteriori estimation to maximize the final posteriori probability.

In an embodiment, a device for recovering a sparse signal of a finite field may include: an input unit configured to receive a signal including a measurement signal obtained by compressed-sensing the target signal; a probability update unit configured to update discrete probability information of a target signal element and discrete probability information of a measurement signal element by exchanging the discrete probability information of the target signal element with the discrete probability information of the measurement signal element a predetermined number of times, based on the relation between the target signal and the measurement signal; and a maximum posterior probability estimation unit configured to calculate a final posteriori probability of the target signal element based on a priori probability of the target signal element and the discrete probability information of the measurement signal element, outputted as the update result, and recover the target signal by performing maximum posteriori estimation on the final posteriori probability.

In an embodiment, there is provided a recording medium that stores a method for recovering a sparse signal of a finite field, in which a sparse signal recovery device recovers a target signal of the finite field from a measurement signal of the finite field, to which a noise signal is added. The method may include: updating discrete probability information of a target signal element of the finite field and discrete probability information of a measurement signal element of the finite field by exchanging the discrete probability information of the target signal element with the discrete probability information of the measurement signal element a predetermined number of times, wherein the target signal element and the measurement signal element are related to each other; calculating a final posteriori probability based on a priori probability of the target signal element and the discrete probability information of the measurement signal element, acquired as the exchange result; and recovering the target signal by performing maximum posteriori estimation to maximize the final posteriori probability.

Advantageous Effects

In accordance with the embodiment of the present invention, the apparatus for recovering a sparse signal of a finite field may recover a signal at the maximum probability according to a measurement signal of a finite field and the sparsity of a target signal. Thus, since the minimum length of a measurement signal required for recovery gradually increases, the complexity may be reduced. Furthermore, the apparatus for recovering a sparse signal of a finite field may have a high signal recovery success rate, and effectively remove noise added to a signal using priori information on the target signal and statistical information on noise.

MODE FOR INVENTION

Figure 1:
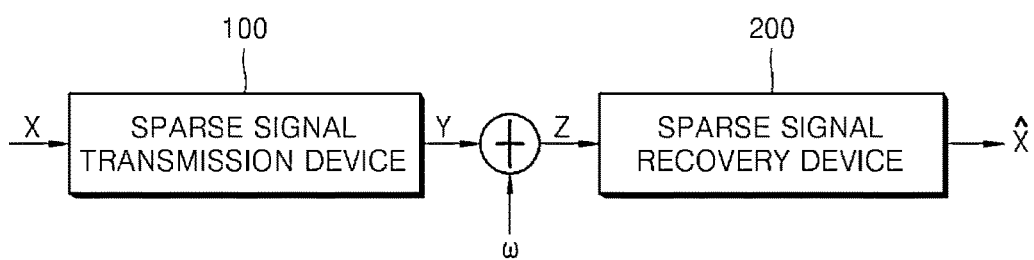
FIG. 1 schematically illustrates a compressed sensing system for a sparse signal of a finite field according to an embodiment of the present invention.

Hereafter, embodiments of the present invention will be described with reference to the accompanying drawings. The following embodiments are provided as examples for efficiently delivering the idea of the present invention to those skilled in the art. Thus, the present invention is not limited to the following embodiments, but may be embodied into other forms. In the figures, the dimensions of layers and regions may be exaggerated for clarity of illustration. Throughout the specification, like reference numerals refer to like elements.

FIG. 1 schematically illustrates a compressed sensing system for a sparse signal of a finite field according to an embodiment of the present invention.

Referring to FIG. 1, the compressed sensing system for a sparse signal of a finite field according to the embodiment of the present invention may include a sparse signal transmission device 100 and a sparse signal recovery device 200.

The sparse signal transmission device 100 measures a target signal X through a measurement matrix A of the finite field, and generates a measurement signal Y of the finite field. At this time, all calculation processes are performed in the finite field. The target signal X is a quantized sparse signal in the finite field having a size of Q, and a target signal element has a nonzero value at a predetermined probability 5. At this time, the measurement matrix A may use a sparse matrix of the finite field having a size of Q. For example, the measurement matrix A may include a measurement matrix of an MxN finite field having a finite field characteristic. At this time, elements of the measurement matrix are 0, 1, 2, . . . , Q−1. $A_{ij}$ represents an (i, j)-th element of the measurement matrix A.

The sparse signal transmission device 100 measures the target signal X by linearly projecting the target signal X to the measurement matrix A. The measurement matrix of the finite field is an M×N matrix in which the number M of rows is smaller than the number N of columns. Thus, when the sparse signal transmission device 100 measures the target signal X through the measurement matrix Z, the compressed measurement signal (Y=AX) is generated at the same time. Thus, the linear projection through the measurement matrix A may be referred to as compressed sensing, and the measurement signal may indicate a compressed-sensed signal.

In the measurement matrix A of the finite field, the number of nonzero elements in each column is fixed to $d_c$. The measurement matrix of the finite field includes elements $A_{ij}$ ranging from 0 to Q−1. Thus, the measurement matrix of the finite field may be easily implemented in hardware, and enable the device to quickly measure and compress a signal.

The sparse signal recovery device 200 recovers the target signal X which is compressed-sensed and transmitted by the sparse signal transmission device 100, based on an input signal Z. At this time, the input signal Z may be obtained by adding a noise signal co to the measurement signal Y generated by the sparse signal transmission device 100, and the sparse signal recovery device 200 may consider the input signal Z as a measurement signal. The noise signal co may include receiver noise added in a wireless channel environment.

$$\max_{X_j:AX+\omega=Z} Pr\{x_j = \tau \mid C, Z\} \quad \text{[Equation 1]}$$

The sparse signal transmission device 200 uses the Bayesian rule to search for a target signal through the maximum posteriori estimation. According to the Bayesian rule, the posteriori probability $[Pr\{x_j=\tau|C,Z\}]$ related to the target signal may be expressed as a likelihood probability $[Pr\{C, Z|x_j=\tau\}]$ and a priori probability $[Pr\{x_j=\tau\}]$ in Equation 2.

$$Pr\{x_j = \tau \mid C, Z\} = \frac{Pr\{x_j = \tau\}}{Pr\{C, Z\}} \times Pr\{C, Z \mid x_j = \tau\} \quad \text{[Equation 2]}$$

In Equation 2, the priori probability $[Pr\{x_j=\tau\}]$ is a given value, and $Pr\{C,Z\}$ represents an evidence probability, and may be ignored in the maximum posteriori estimation because the evidence probability is common in all elements. The likelihood probability $[Pr\{C,Z|x_j=\tau\}]$ indicates the probability of all constraint equations related to $x_j$ with Y. Furthermore, since elements x of the target signal X are independent of each other, the posteriori probability of each element may be independently estimated as expressed by Equation 3. At this time, the entire index group of the target signal X is set to v={1, 2, . . . , N}, and the entire index group of the measurement signal Y is set to c={1, 2, . . . , M}. Furthermore, $L_v(j)$ represents an index group of measurement signal elements $y_i \in L_{V(j)}$ related to the target signal element $x_j$, and $L_c(i)$ represents an index group of target signal elements $x_{j \in L_{V(i)}}$ related to the target signal element $y_i$. $L_v(j)$ and $L_c(i)$ may be defined as expressed by Equation 4. The relation between the target signal element X and the measurement signal element Y is set according to the measurement matrix element $A_{ij}$.

$$Pr\{x_j = \tau \mid C, Z\} = \frac{Pr\{x_j = \tau\}}{Pr\{C, Z\}} \times \prod_i Pr\{c_i, z_i \mid x_j = \tau\} \quad \text{[Equation 3]}$$

$$L_v(j) = \{\text{all } i \in c : A_{ij} \neq 0\} \subseteq c \quad \text{[Equation 4]}$$
$$L_c(i) = \{\text{all } j \in v : A_{ij} \neq 0\} \subseteq v$$

Under the supposition that the sparse signal recovery device 200 knows the priori probability [Pr{$x_j=\tau$}] of the target signal based on belief propagation, the sparse signal recovery device 200 repetitively updates the likelihood probability and the posteriori probability, which are related to the target signal element $x_j$ and the measurement signal element $y_i$, and gradually finds the actual value of the target signal. Then, the sparse signal recovery device 200 determines a signal, at which the final posteriori probability [Pr{$x_j$|C,Z}] calculated as the repetitive update result is maximized through the maximum posteriori estimation of Equation 1, as the target signal $\hat{x}_j$.

Figure 2:
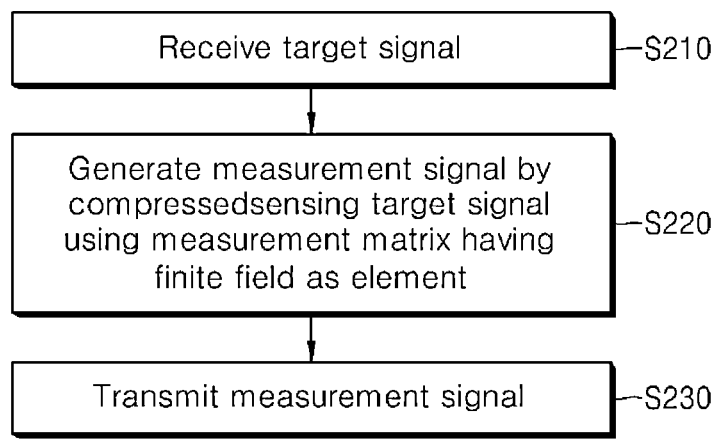
FIG. 2 is a flowchart illustrating a method for transmitting a sparse signal of a finite field in the compressed sensing system according to the embodiment of the present invention.

FIG. 2 is a flowchart illustrating a method for transmitting a sparse signal of a finite field according to an embodiment of the present invention.

Referring to FIG. 2, the sparse signal transmission device 100 receives a target signal X to be transmitted at step S210. The target signal X is a sparse signal which has nonzero values at a sparsity ratio δ. When the length of the signal is N, $X \in F_Q^N$ which is the length N of a signal having a size of Q in a finite field. At this time, the number of nonzero elements in the target signal X is based on binominal distribution [B(N,δ)]. Suppose that the values of nonzero elements are based on discrete uniform distribution and the elements of the target signal X are identically independently distributed (iid). Thus, the discrete probability distribution function P of the target signal elements $x_j$ is defined as expressed by Equation 5. Furthermore, the distribution of the target signal elements defined in Equation 5 is used as a priori probability for signal recovery.

$$Pr\{x_j = \tau\} = \begin{cases} 1 - \delta, & x_j = 0, \\ \delta/(Q-1), & x_j \neq 0, \end{cases} \quad \text{[Equation 5]}$$

The sparse signal transmission device 100 compressed-senses the target signal using the measurement matrix including elements in a finite field having a size of Q, and generates a measurement signal at step S220. Each element $A_{ij}$ in the measurement matrix is an element of the finite field having a size of Q, and the number M of rows is smaller than the number N of columns. Thus, when the sparse signal transmission device 100 measures the target signal X through the measurement matrix A, a measurement signal having a smaller length than the target signal is outputted. That is, the sparse signal transmission device 100 generates the compressed-sensed measurement signal Y through the measurement matrix at the same time as the measurement.

The sparse signal transmission device 100 transmits the measurement signal at step S230.

Figure 3:
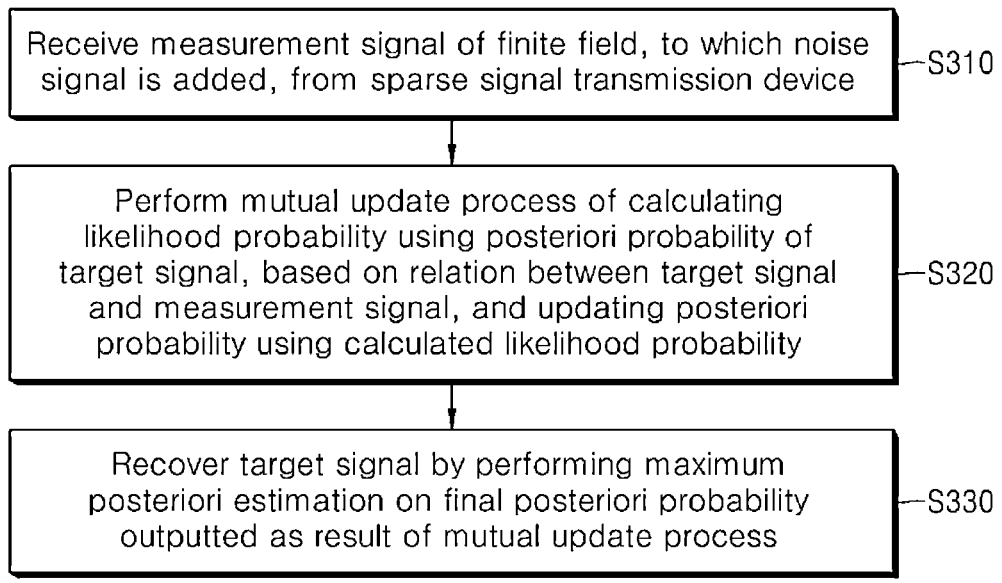
FIG. 3 is a flowchart illustrating a method for recovering a sparse signal of a finite field according to an embodiment of the present invention.

FIG. 3 is a flowchart illustrating a method for recovering a sparse signal of a finite field according to an embodiment of the present invention.

Referring to FIG. 3, the sparse signal recovery device 200 recovers a target signal from a received signal, based on previously known information. The sparse signal recovery device 200 knows the statistical probability distribution $P_\omega$ of a noise signal ω, the priori probability distribution Pj of the target signal X, and the measurement matrix A used by the sparse signal transmission device 100 to compress the target signal. The priori probability of the target signal may be given as expressed by Equation 5, and the statistical probability Pr(ω) of the noise signal may be expressed by Equation 6.

$$Pr\{\omega_i = \tau\} = \begin{cases} 1 - \varepsilon, & \omega_i = 0, \\ \varepsilon/(Q-1), & \omega_i \neq 0, \end{cases} \quad \text{[Equation 6]}$$

The sparse signal recovery device 200 receives a measurement signal Z, to which a noise signal is added, from the sparse signal transmission device at step S310. At this time, the measurement signal Z is obtained by measuring the target signal through the measurement matrix, and contains the noise signal.

The sparse signal recovery device 200 calculates a likelihood probability from the posteriori probability of the target signal, using the relation between the target signal and the measurement signal, and performs a mutual update process of updating the posteriori probability from the calculated likelihood probability, at step S320. Referring to FIG. 3, the sparse signal recovery device 200 sets the relation between the target signal and the measurement signal using the measurement matrix A, and exchanges probability information corresponding to the target signal and the measurement signal which are related to each other. Furthermore, the sparse signal recovery device 200 updates the probability information by repeating the mutual update process a predetermined number of times.

In the mutual update process based on Equation 3, the likelihood probability $$\left[ \prod_{i \in L_v(j)} Pr(c_i, z_i | x_j) \right]$$

] is calculated by multiplying the probabilities of measurement signal elements $Z_{i \in L_v(j)}$ related to the target signal element $x_j$, that is, measurement signal elements of which the indexes belong to L(j). At this time, the measurement signal element $Z_i$ needs to satisfy a constraint condition $$\left[ c_i : \sum_i A_{ij} \cdot x_j + \omega_i = z_i \right]$$

of an estimated signal. The constraint condition indicates the relation between the target signal X and the measurement signal Z obtained by adding a noise signal co to the signal (Y=AX) transmitted by the sparse signal transmission device 100. Thus, the probability [Pr($c_i,z_i|x_j$)] of the measurement signal element $Z_i$ may indicate the constraint probability of the i-th element of the measurement signal Z. Therefore, the sparse signal recovery device 200 calculates the constraint probabilities [Pr($c_i,z_i|x_j$)] of a plurality of measurement signal elements $Z_{i \in L_v(j)}$ related to the target signal $x_j$, and calculates the likelihood probability $$\left[ \prod_{i \in L_v(j)} Pr(c_i, z_i | x_j) \right]$$

by multiplying the calculated constraint probabilities.

As such, the likelihood probability is calculated through the constraint probabilities of the measurement signal elements $Z_{i \in L_v(j)}$ related to the target signal element $x_j$. Thus, the sparse signal recovery device 200 repetitively calculates the discrete probability information $[\Pr\{x_j|C,Z\}]$ of the related target signal element $x_j$ and the discrete probability information $[\Pr(c_i,z_i|x_j)]$ of the measurement signal elements $Z_{i \in L_v(j)}$, and updates the corresponding discrete probability information. That is, the sparse signal recovery device 200 updates the discrete probability information $[\Pr\{x_j|C,Z\}]$ of the target signal elements $x_j$ based on the discrete probability information of the measurement signal elements $Z_{i \in L_v(j)}$ related to the target signal element, and updates the discrete probability information $[\Pr(c_i,z_i|x_j)]$ of the measurement signal elements $Z_i$ based on the discrete probability information of the target signal elements $x_{j \in L_c(i)}$ related to the measurement signal element. The sparse signal recovery device 200 repeats the update process a predetermined number of times.

The sparse signal transmission device 200 recovers the target signal by performing maximum posteriori estimation on the maximum posteriori probability outputted as the result of the mutual update process at step S330. Referring to Equation 3, the final posteriori probability is calculated by multiplying the likelihood probability $$\left[ \prod_{i \in L_v(j)} Pr(c_i, z_i | x_j) \right]$$

outputted as the result of the mutual update process by the priori probability $[\Pr\{x_j=\tau\}]$ of the target signal $x_j$. The sparse signal transmission device 200 determines a signal having the largest probability value at the final posterior probability as the target signal, as expressed by Equation 1.

Now, a method in which the sparse signal recovery device 200 performs the mutual update process will be described. During the mutual update process, the sparse signal recovery device 200 repetitively exchange the discrete probability information among the measurement signals $Z_{i \in L_v(j)}$ related to the target signal elements $x_j$.

Figure 4:
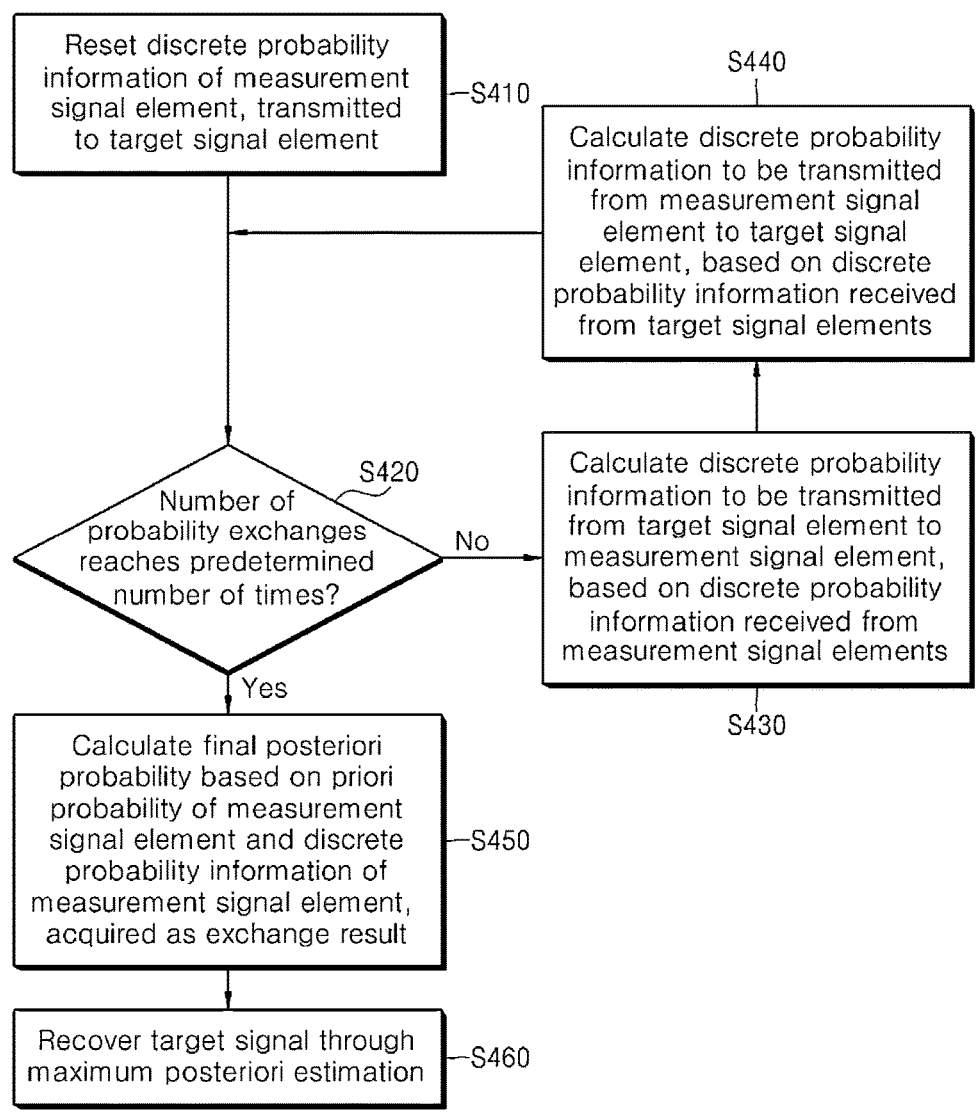
FIG. 4 is a flowchart illustrating a method for recovering a sparse signal of a finite field according to another embodiment of the present invention.

FIG. 4 is a flowchart illustrating a method for recovering a sparse signal of a finite field according to another embodiment of the present invention.

Referring to FIG. 4, the sparse signal recovery device 200 exchanges the discrete probability information $q_{j \to i}^l$ of the target signal element with the discrete probability information $r_{i \to j}^l$ of the measurement signal element a predetermined number of times, and updates the respective pieces of discrete probability information of the target signal element and the measurement signal element which are related to each other. Furthermore, the sparse signal recovery device 200 recovers the target signal by performing the maximum posteriori estimation based on the updated discrete probability information.

The sparse signal recovery device 200 resets the discrete probability information of the measurement signal element $Z_i$, transmitted to the target signal element $x_j$, at step S410. That is, the sparse signal recovery device 200 may reset the discrete probability information of the measurement signal element $Z_i$, transmitted to the target signal elements $x_j$, to the measurement probability $(r_{i \to j}^{l=0}=P_\omega)$. At this time, the discrete probability distribution $r_{i \to j}^{l=0}$ indicates the initial discrete probability information transmitted to a j-th target signal element from an i-th measurement signal element in the initial state where the discrete probability distribution is not updated.

The sparse signal recovery device 200 determines whether the number 1 at which the respective pieces of discrete probability information of the target signal element and the measurement signal element are exchanged with each other satisfies a predetermined number $1_{max}$, at step S420.

When the exchange number 1 is not larger than the predetermined number $1_{max}$, the sparse signal recovery device 200 calculates discrete probability information $q_{j \to i}^l$ which is to be transmitted to the measurement signal element $Z_i$ from the target signal element $x_j$, based on the discrete probability information $r_{i' \to j}^{l-1}$ received from a plurality of measurement signal elements related to the target signal element $x_j$, at step S430. The discrete probability information $q_{j \to i}^l$ is the posteriori probability of the target signal, calculated except for the discrete probability information of the measurement signal element, which is to be transmitted. That is, the sparse signal recovery device 200 may calculate the discrete probability information $q_{j \to i}^l$ by multiplying the priori probability by the respective pieces of discrete probability information $r_{i' \to j}^{l-1}$ received from the other measurement signal elements $[Z_{i' \in L_v(j), i' \neq i}]$ excluding the measurement signal element $Z_i$ of which the discrete probability information is to be transmitted. The discrete probability information $q_{j \to i}^l$ to be transmitted from the target signal element $x_j$ to the measurement signal element $Z_i$ may be expressed by Equation 7. At this time, the discrete probability information $q_{j \to i}^l$ indicates the discrete probability information transmitted from the j-th target signal element to the i-th measurement signal element at the l-th exchange. Furthermore, $\gamma^l$ represents a constant for normalizing the discrete probability information $q_{j \to i}^l$ at the l-th exchange, and $\Sigma_{q_{j \to i}^l}=1$ is established through $\gamma^l$ such that the discrete probability information is valid as a probability distribution. $\Pr\{x_j=\tau\}$ represents the priori probability of the target signal element $x_j$.

$$q_{j \to i}^l : \gamma^l \times Pr\{x_j = \tau\} \times \prod_{i' \in L_v(j), i' \neq i} r_{i' \to j}^{l-1} \qquad \text{[Equation 7]}$$

The sparse signal recovery device 200 calculates discrete probability information $r_{i \to j}^l$ to be transmitted from the measurement signal element $Z_i$ to the target signal elements $x_j$, based on discrete probability information received from a plurality of target signal elements related to the measurement signal elements $Z_i$, at step S440. The discrete probability information $r_{i \to j}^l$ is the constraint probability of the measurement signal, calculated except for the discrete probability information of the target signal element, which is to be transmitted. That is, the sparse signal recovery device 200 calculates the discrete probability information $r_{i \to j}^l$ through circular convolution of statistical information of the measurement signal to which a noise signal is added and discrete probability information received from all of the target signal elements $x_{j' \in L_c(i), j' \neq j}$ excluding the target signal element $x_j$ to which the discrete probability information is to be transmitted. The discrete probability information $r_{i \to j}^l$ to be transmitted from the measurement signal element $Z_i$ to the target signal element $x_j$ may be expressed by Equation 8. At this time, the sparse signal recovery device 200 sets the initial value to $r_{i \to j}^{l=0}=P_\omega$ so as to use Equation 7. The discrete probability information $r_{i \to j}^l$ indicates the discrete probability information transmitted from the i-th measurement signal element to the j-th target signal element at the l-th exchange. $\Pr\{\omega_i=\tau\}$ represents the statistical information of noise signals. Furthermore, an operator ($\bigotimes$) of Equation 8 represents circular convolution for a predetermined size Q, and may be calculated through FFT (Fast Fourier Transform) or Hadamard Transform as expressed by Equation 9.

$$r^l_{i \to j} := \left[ \left( \bigotimes_{j' \in L_c(i), j' \neq j} q^{l-1}_{j' \to i} \right) \otimes Pr\{\omega_i = \tau\} \right] \quad \text{[Equation 8]}$$

$$r^l_{i \to j} := IFFT\left( \left[ \left( \prod_{j' \in L_c(i), j' \neq j} FFT(q^{l-1}_{j' \to i}) \right) \times FFT(Pr\{\omega_i = \tau\}) \right] \right) \quad \text{[Equation 9]}$$

When the exchange number l reaches the predetermined number $l_{max}$, the sparse signal recovery device 200 calculates the final posteriori probability [Pr{$x_j=\tau|C,Z$}], based on the priori probability of the target signal element and the discrete probability information $r_{i \to j}^{l=l_{max}}$ of the measurement signal element, acquired as the exchange result, at step S450. Referring to Equation 3, the final posteriori probability [Pr{$x_j=\tau|C,Z$}] is calculated by multiplying the priori probability [Pr{$x_j=\tau$}] of the target signal elements by the likelihood probability $$\left[ \prod_{i \in L_v(j)} Pr(c_i, z_i | x_j) \right]$$

obtained on the basis of the discrete probability information [$r_{i \to j}^{l=l_{max}} := Pr\{c_i, z_i | x_j\}$] of the measurement signal elements $Z_{i \in L_v(j)}$ related to the target signal element xj. As a result, the sparse signal recovery device 200 may calculate the final posteriori probability as expressed by Equation 10. Here, $\gamma_2$ is a constant for normalizing the final posteriori probability, and $\Sigma Pr\{x_j|C,Z\}=1$ is established through $\gamma_2$ such that the final posteriori probability is valid as probability distribution.

$$Pr\{x_j = \tau | C, Z\} = \gamma_2 \times Pr\{x_j = \tau\} \times \quad \text{[Equation 10]}$$
$$\prod_{i \in L_v(j)} Pr\{c_i, z_i | x_j = \tau\}$$
$$= \gamma_2 \times Pr\{x_j = \tau\} \times \prod_{i \in L_v(j)} r_{i \to j}^{l=l_{max}}$$

The sparse signal recovery device 200 recovers the target signal by performing the maximum posteriori estimation to maximize the final posteriori probability at step S460. The posteriori probability distribution Pr{$x_j=\tau|C,Z$} of the target signal elements xj converges to a distribution having the highest probability for the actual value of the target signal element $x_j$ through the repeated update through the belief propagation algorithm.

Figure 5:
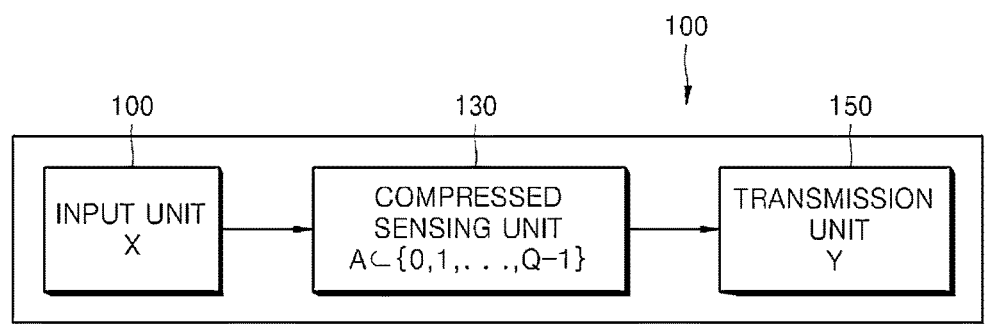
FIG. 5 is a block diagram of a device for transmitting a sparse signal of a finite field according to an embodiment of the present invention.

FIG. 5 is a block diagram of a device for transmitting a sparse signal of a finite field according to an embodiment of the present invention.

Referring to FIG. 5, the sparse signal transmission device 100 may include an input unit 110, a compressed sensing unit 130, and a transmission unit 150.

The input unit 110 receives a target signal X of a finite field, which is to be compressed and transmitted. The target signal X is a sparse signal.

The compressed sensing unit 130 measures and compresses the target signal based on a measurement matrix A in the finite field having a size of Q. The compressed sensing unit 130 measures the target signal X through the measurement matrix A of the finite field in which the number M of rows is smaller than the number N of columns, and outputs the compressed measurement signal (Y=AX).

The transmission unit 150 transmits the compressed signal.

Figure 6:
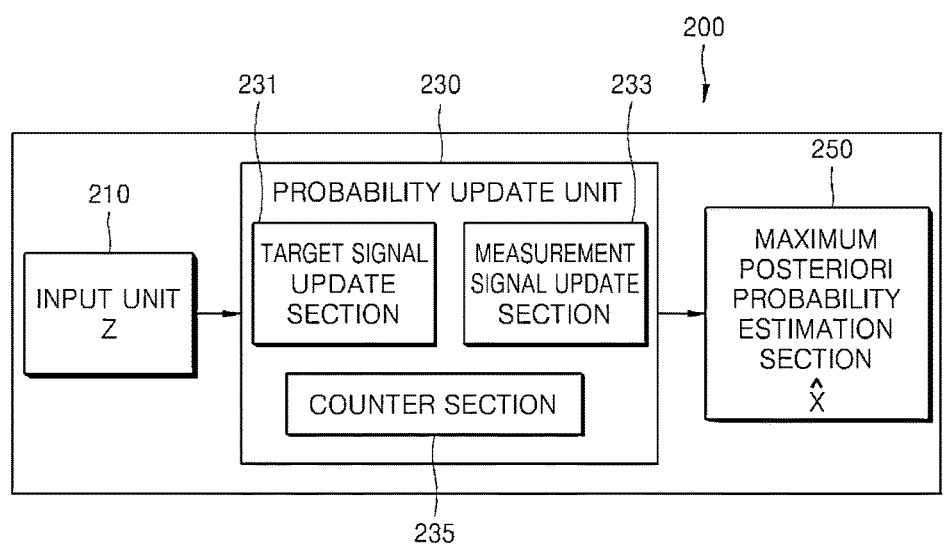
FIG. 6 is a block diagram of a device for recovering a sparse signal of a finite field according to an embodiment of the present invention.

FIG. 6 is a block diagram of a device for recovering a sparse signal of a finite field according to an embodiment of the present invention.

Referring to FIG. 6, the sparse signal recovery device 200 may include an input unit 210, a probability update unit 230, and a maximum posteriori probability estimation unit 250. The probability update unit 230 may include a target signal probability update section 231, a measurement signal probability update section 233, and a counter section 235.

The input unit 210 receives a signal Z including a signal Y obtained by compressed-sensing the target signal X. That is, the input unit 210 receives the measurement signal Z to which noise ω is added, and the measurement signal Z is a measurement signal obtained by compressed-sensing the target signal X through the measurement matrix of the finite field. At this time, the measurement signal Z received by the sparse signal recovery device 200 is a signal obtained by adding the noise signal W to the actual measurement signal Y transmitted by the sparse signal transmission device 100. The probability update unit 230 exchanges the discrete probability information of a target signal element with the discrete probability information of a measurement signal element a predetermined number of times, based on the relation between the target signal and the measurement signal, and updates the respective pieces of discrete probability information of the target signal element and the measurement signal element. For such a mutual update process, the probability update unit 230 may include a target signal probability update section 231, a measurement signal probability update section 233, and a counter section 235.

The target signal probability update section 231 may update the discrete probability information of the target signal element, based on the discrete probability information of the target signal element, which is received from the measurement signal probability update unit 233. Furthermore, the target signal probability update unit 231 calculates discrete probability information $q_{j \to i}^l$ to be transmitted to a measurement signal element related to the target signal element, as expressed by Equation 7, and transmits the calculated discrete probability information to the measurement signal probability update section 233.

The measurement signal probability update section 233 may update the discrete probability information of the measurement signal element, based on the discrete probability information of the target signal element, which is received from the target signal probability update unit 231. Furthermore, the measurement signal probability update unit 233 calculates discrete probability information $r_{i \to j}^l$ to be transmitted as a target signal element related to the measurement signal element, as expressed by Equation 7, and transmits the calculated discrete probability information to the target signal probability update section 231.

The counter section 235 checks the number l of probability exchanges between the target signal probability update section 231 and the measurement signal probability update section 233. The counter section 235 determines whether the probability exchange number l reached a predetermined number $l_{max}$, and controls the update for the respective pieces of discrete probability information of the target signal element and the measurement signal element.

That is, the counter section 235 enables the probability exchange between the target signal probability update section 231 and the measurement signal probability update section 233 until the probability exchange number l reaches the predetermined number $l_{max}$, and stops the probability update when the probability exchange number l reaches the predetermined number $l_{max}$.

The maximum posteriori probability estimation unit 250 calculates the final posteriori probability of the target signal element, based on the priori probability of the target signal element and the discrete probability information of the measurement signal element, outputted as the update result, as expressed by Equation 3. The maximum posteriori probability estimation unit 250 searches for an estimated target signal by performing the maximum posteriori estimation on the final posteriori probability.

As such, the sparse signal transmission device 100 compresses the target signal based on the measurement matrix of the finite field. Thus, the sparse signal transmission device 100 may be easily implemented in hardware, and quickly measure and compress the target signal. Furthermore, the sparse signal recovery device 200 may update probability information while exchanging the probability related to the target signal and the probability related to the measurement signal, based on the belief propagation algorithm. Thus, the sparse signal recovery device 200 may calculate the final posteriori probability which is the closest to an actual target signal. Furthermore, since the sparse signal recovery device 200 performs the maximum posteriori estimation based on the final posteriori probability, the sparse signal recovery device 200 exhibits a high signal recovery success rate. Furthermore, the sparse signal recovery device 200 recovers a sparse target signal measured through the measurement matrix of the finite field. Thus, since the minimum length of the measurement signal required for recovery gradually increases, the complexity may be reduced.

While various embodiments have been described above, it will be understood to those skilled in the art that the embodiments described are by way of example only. Accordingly, the disclosure described herein should not be limited based on the described embodiments.

According to the embodiments of the present invention, the sparse signal recover method and device may recover a signal using the sparsity of a target signal, exhibit a high signal recovery success rate, and effectively remove noise added to a signal using priori information of the target signal and statistical information of noise.

The invention claimed is:

1. A method performed by a compressed sensing system comprising a sparse signal transmission device and a sparse signal recovery device, for recovering a sparse signal of a finite field from a measurement signal, the method comprising:

measuring, by the sparse signal transmission device, a target signal by applying a measurement matrix of the finite field to the target signal;

generating, by the sparse signal transmission device, the measurement signal of the finite field and transmitting the generated measurement signal via a wireless channel;

receiving, by the sparse signal recovery device, the measurement signal from the sparse signal transmission device, the received measurement signal comprising a noise signal added via the wireless channel;

updating, by the sparse signal recovery device, discrete probability information of a target signal element of the transmitted measurement signal and discrete probability information of a measurement signal element of the finite field by exchanging the discrete probability information of the target signal element with the discrete probability information of the measurement signal element a predetermined number of times, wherein the target signal element and the measurement signal element are related to each other;

calculating, by the sparse signal recovery device, a final posteriori probability of the target signal element based on a priori probability of the target signal element and the updated discrete probability information of the measurement signal element; and outputting, by the sparse signal recovery device, a recovered target signal by performing maximum posteriori estimation to maximize the calculated final posteriori probability.

2. The method of claim 1, wherein the updating the discrete probability information comprises:

updating, by the sparse signal recovery device, the discrete probability information of the target signal element based on the discrete probability information of the measurement signal element related to the target signal element; and updating, by the sparse signal recovery device, the discrete probability information of the measurement signal element based on the discrete probability information of the target signal element related to the measurement signal element, wherein the updating the discrete probability information of the target signal element and the updating the discrete probability information of the measurement signal element are repeated the predetermined number of times.

3. The method of claim 1, wherein the updating the discrete probability information comprises:

calculating, by the sparse signal recovery device, first discrete probability information to be transmitted from a first target signal element to a measurement signal element related to the first target signal element, based on discrete probability information received from a plurality of measurement signal elements related to the first target signal element;

calculating, by the sparse signal recovery device, second discrete probability information to be transmitted from a first measurement signal element to a target signal element related to the first measurement signal element, based on discrete probability information received from a plurality of target signal elements related to the first measurement signal element; and determining, by the sparse signal recovery device, whether a number of times of the exchanging the discrete probability information of the target signal element with the discrete probability information of the measurement signal element reaches the predetermined number of times, and repeating the updating the discrete probability information of a target signal element of the finite field and the discrete probability information of a measurement signal element of the finite field.

4. The method of claim 3, wherein the calculating of the first discrete probability information to be transmitted to the measurement signal element related to the first target signal element comprises:

calculating, by the sparse signal recovery device, a first value by multiplying respective pieces of discrete probability information received from the plurality of measurement signal elements related to the first target signal element, excluding the measurement signal element to which the first discrete probability information is to be transmitted;

calculating, by the sparse signal recovery device, a second value by multiplying the first value by a priori probability of the first target signal element; and calculating, by the sparse signal recovery device, the first discrete probability information by normalizing the second value.

5. The method of claim 3, wherein the calculating of the second discrete probability information to be transmitted to the target signal element related to the first measurement signal element comprises:

calculating, by the sparse signal recovery device, a first value through circular convolution for respective pieces of discrete probability information received from the plurality of target signal elements related to the first measurement signal element, excluding the target signal element to which the second discrete probability information is to be transmitted;

calculating, by the sparse signal recovery device, a second value through circular convolution for the first value and statistical information of the measurement signal; and calculating, by the sparse signal recovery device, the second discrete information by normalizing the second value.

6. The method of claim 5, wherein the circular convolution uses FFT (Fast Fourier Transform) or Hadamard transform.

7. The method of claim 1, wherein a relation between the target signal element and the measurement signal element is determined based on the measurement matrix of the finite field.

8. The method of claim 1, wherein the calculating the final posteriori probability comprises:

calculating, by the sparse signal recovery device, a likelihood probability by multiplying discrete probability information of measurement signal elements related to the target signal; and calculating, by the sparse signal recovery device, the final posteriori probability based on the calculated likelihood probability and the priori probability.

9. The method of claim 1, wherein the discrete probability information of the target signal element comprises posteriori probability information of the target signal element.

10. The method of claim 1, wherein the discrete probability information of the measurement signal element comprises likelihood probability information related to a posteriori probability of the target signal element.

11. The method of claim 1, wherein the discrete probability information of the measurement signal element comprises a constraint probability of a measurement signal element which satisfies a constraint condition.

12. The method of claim 11, wherein the constrain condition the comprises the relation between the target signal and a signal received as the measurement signal.

13. A compressed sensing system for recovering a sparse signal of a finite field from a measurement signal, the compressed sensing system comprising:

a sparse signal transmission device configured to
measure a target signal by compressed-sensing the target signal,
generate the measurement signal of the finite field, and
transmit the generated measurement signal via a wireless channel; and a sparse signal recovery device comprising a processor for recovering the sparse signal of the finite field, wherein said processor comprising
an input unit configured to receive, from the sparse signal transmission device, the measurement signal, the received measurement signal comprising a noise signal added via the wireless channel,
a probability update unit configured to update discrete probability information of a target signal element and discrete probability information of a measurement signal element of the transmitted measurement signal by exchanging the discrete probability information of the target signal element with the discrete probability information of the measurement signal element a predetermined number of times, based on a relation between the target signal and the measurement signal, and
a maximum posterior probability estimation unit configured to
calculate a final posteriori probability of the target signal element based on a priori probability of the target signal element and the updated discrete probability information of the measurement signal element, and
output a recovered target signal by performing maximum posteriori estimation on the calculated final posteriori probability.

14. The compressed sensing system of claim 13, wherein the measurement signal is obtained by compressed-sensing the target signal through a measurement matrix of the finite field.

15. The compressed sensing system of claim 13, wherein the probability update unit comprises:

a target signal probability update section configured to
update the discrete probability information of the target signal element based on the exchanged discrete probability information of the measurement signal element, and
calculate discrete probability information to be transmitted to the measurement signal element related to the target signal element;

a measurement signal probability update section configured to
update the discrete probability information of the measurement signal element based on the exchanged discrete probability information received from the target signal probability update section,
calculate discrete probability information to be transmitted to the target signal element related to the measurement signal element, and
transmit the calculated discrete probability information to the target signal probability update section; and a counter section configured to
calculate a number of probability exchanges between the target signal probability update section and the measurement signal probability update section, and
control the updates for respective pieces of the discrete probability information of the target signal element and the measurement signal element by determining whether the number of probability exchanges reaches the predetermined number of times.

16. The compressed sensing system of claim 13, wherein the discrete probability information of the target signal element comprises posteriori probability information of the target signal element.

17. The compressed sensing system of claim 13, wherein the discrete probability information of the measurement signal element comprises likelihood probability information related to the posteriori probability of the target signal element.

18. The compressed sensing system of claim 13, wherein the maximum posteriori probability estimation unit is configured to
calculate a likelihood probability by multiplying all pieces of updated discrete probability information of measurement signal elements related to the target signal, and
calculate the final posteriori probability based on the calculated likelihood probability and the priori probability.

19. A non-transitory computer readable recording medium recording a program, the program, when executed by a processor of a computing device, causing the processor to execute—a method for recovering a sparse signal of a finite field, the method comprising:
receiving the measurement signal from a sparse signal transmission device via a wireless channel, wherein the measurement signal is generated by the sparse signal transmission device by applying a measurement matrix of the finite field to a target signal and comprises a noise signal added via the wireless channel;
updating discrete probability information of a target signal element of the finite field and discrete probability information of a measurement signal element of the transmitted measurement signal by exchanging the discrete probability information of the target signal element with the discrete probability information of the measurement signal element a predetermined number of times, wherein the target signal element and the measurement signal element are related to each other;
calculating a final posteriori probability of the target signal element based on a priori probability of the target signal element and the updated discrete probability information of the measurement signal element; and
outputting a recovered target signal by performing maximum posteriori estimation to maximize the calculated final posteriori probability.

20. The non-transitory computer readable recording medium of claim 19, wherein the updating the discrete probability information comprises:
calculating first discrete probability information to be transmitted from a first target signal element to a measurement signal element related to the first target signal element, based on discrete probability information received from a plurality of measurement signal elements related to the first target signal element;
calculating second discrete probability information to be transmitted from a first measurement signal element to a target signal element related to the first measurement signal element, based on discrete probability information received from a plurality of target signal elements related to the first measurement signal element; and
determining whether a number of times for the exchanging the discrete probability information of the target signal element with the discrete probability information of the measurement signal element reaches the predetermined number of times, and repeating updating the discrete probability information of a target signal element of the finite field and the discrete probability information of a measurement signal element of the finite field.

* * * * *